(12) United States Patent
Suzuki et al.

(10) Patent No.: US 9,448,256 B2
(45) Date of Patent: Sep. 20, 2016

(54) CURRENT SENSOR SUBSTRATE AND CURRENT SENSOR

(75) Inventors: Kenji Suzuki, Tokyo (JP); Hideto Imajo, Tokyo (JP); Daigo Takagi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 504 days.

(21) Appl. No.: 14/131,723

(22) PCT Filed: Jul. 11, 2012

(86) PCT No.: PCT/JP2012/004488
§ 371 (c)(1),
(2), (4) Date: Jan. 9, 2014

(87) PCT Pub. No.: WO2013/008462
PCT Pub. Date: Jan. 17, 2013

(65) Prior Publication Data
US 2014/0167736 A1 Jun. 19, 2014

(30) Foreign Application Priority Data

Jul. 13, 2011 (JP) .................................. 2011-154658
May 18, 2012 (JP) .................................. 2012-114392

(51) Int. Cl.
| | |
|---|---|
| G01R 15/14 | (2006.01) |
| G01R 15/20 | (2006.01) |
| H01L 23/00 | (2006.01) |

(52) U.S. Cl.
CPC ............. G01R 15/146 (2013.01); G01R 15/20 (2013.01); H01L 24/37 (2013.01); H01L 24/40 (2013.01);

(Continued)

(58) Field of Classification Search
CPC ...... G01R 15/18; G01R 15/20; G01R 19/20; G01R 33/0283; G01R 15/146; G05G 2009/04755
USPC ....................................................... 324/117 R
See application file for complete search history.

(56) References Cited

U.S. PATENT DOCUMENTS

| | | | | |
|---|---|---|---|---|
| 3,787,638 | A | * | 1/1974 | Murai .................. G11B 5/1871 29/603.1 |
| 6,236,200 | B1 | * | 5/2001 | Nekado .................. G01V 3/105 324/174 |

(Continued)

FOREIGN PATENT DOCUMENTS

| | | |
|---|---|---|
| EP | 1107328 A2 | 6/2001 |
| JP | 2001-165963 A | 6/2001 |

(Continued)

OTHER PUBLICATIONS

International Preliminary Report on Patentability and Written Opinion issued in corresponding International Patent Application No. PCT/JP2012/004488 dated Jan. 23, 2014.

(Continued)

*Primary Examiner* — Thomas Valone
(74) *Attorney, Agent, or Firm* — Morgan, Lewis & Bockius LLP

(57) ABSTRACT

It is intended to reduce manufacturing cost in a current sensor including a primary conductor having a U-shaped current path. A current sensor includes a primary conductor having a U-shaped current path, a support portion for supporting a magneto-electric conversion element, and a lead terminal connected to the support portion, and wherein the current path is not overlapped with the support portion in a plan view, while being formed so as to have a height different from that of the support portion in a side view.

22 Claims, 17 Drawing Sheets

(52) U.S. Cl.
CPC ............ *H01L 24/73* (2013.01); *H01L 24/05* (2013.01); *H01L 24/48* (2013.01); *H01L 2224/05554* (2013.01); *H01L 2224/40095* (2013.01); *H01L 2224/40245* (2013.01); *H01L 2224/48091* (2013.01); *H01L 2224/48247* (2013.01); *H01L 2224/49171* (2013.01); *H01L 2224/73221* (2013.01); *H01L 2924/00014* (2013.01); *H01L 2924/181* (2013.01)

(56) References Cited

U.S. PATENT DOCUMENTS

| | | |
|---|---|---|
| 6,462,531 B1 | 10/2002 | Ohtsuka |
| 6,683,448 B1 | 1/2004 | Ohtsuka |
| 2003/0122565 A1 | 7/2003 | Van Horn et al. |
| 2004/0080307 A1 | 4/2004 | Ohtsuka |
| 2010/0315066 A1* | 12/2010 | Hashio ............... G01R 1/06788 324/156 |
| 2015/0276814 A1* | 10/2015 | Nakajima ............ G01R 15/202 324/244 |

FOREIGN PATENT DOCUMENTS

| | | |
|---|---|---|
| JP | 2001-174486 A | 6/2001 |
| JP | 2001-339109 A | 12/2001 |
| JP | 2009-210481 A | 9/2009 |
| TW | 200617952 A | 6/2006 |
| TW | 200807732 A | 2/2008 |
| WO | 2006/130393 A1 | 12/2006 |

OTHER PUBLICATIONS

International Search Report issued in corresponding International Patent Application No. PCT/JP2012/004488 dated Aug. 7, 2012.

* cited by examiner

CURRENT SENSOR SUBSTRATE AND CURRENT SENSOR

TECHNICAL FIELD

The present invention relates to a current sensor substrate and a current sensor, and in more detail, to a current sensor substrate and a current sensor wherein a primary conductor having a U-shaped current path is provided.

BACKGROUND ART

For a current sensor for measuring electric current that flows through a conductor, conventionally known is a method of detecting magnetic flux to be generated by the flow of measurement current in the surrounding of the conductor. For example, in such a method, a magneto-electric conversion element is disposed in the vicinity of a primary conductor through which the measurement current flows.

FIG. 1 (corresponding to FIG. 7 in PTL 1) shows an example of a conventional current sensor. A U-shaped current conductor portion 204a is formed in a conductive clip 204, and a hole element 208 is disposed inside the U-shape. Magnetic flux density becomes high in the vicinity of the center of the inside of the U-shape, and thereby, measurement sensitivity is enhanced.

CITATION LIST

Patent Literature

PTL1: Pamphlet of International Patent Publication No. WO2006/130393

SUMMARY OF INVENTION

Technical Problem

However, the current sensor shown in FIG. 1 requires manufacturing efforts such as separately providing the conductive clip 204 and coupling the conductive clip 204 to lead terminals 202a to 202d. This results in cost increase.

The present invention has been produced in view of such a drawback as described above, and it is the first object thereof to reduce manufacturing cost in a current sensor including a primary conductor having a U-shaped current path. Further, it is the second object thereof to provide a substrate for the current sensor.

Solution to Problem

To achieve the objects as described above, a first aspect of the present invention relates to a current sensor substrate comprising: a primary conductor having a U-shaped current path; a support portion for supporting a magneto-electric conversion element; and a signal terminal side member having a lead terminal connected to the support portion, and wherein the current path is not overlapped with the support portion in a plan view, while being formed so as to have a height different from a height of the support portion in a side view.

Moreover, a second aspect of the present invention relates to the first aspect, and wherein the lead terminal may be connected to the support portion through a step.

Moreover, a third aspect of the present invention relates to the first or second aspect, and wherein the support portion may have a cutout portion, and the current path may be disposed in the cutout portion in a plan view.

Moreover, a fourth aspect of the present invention relates to the first to third aspects, and wherein the primary conductor may have a step portion connected to the current path.

A fifth aspect of the present invention relates to any of the first to fourth aspects, and may further comprise a magnetic material disposed so as to be overlapped with the U-shaped current path in a plan view.

A sixth aspect of the present invention relates to any of the first to fifth aspects, and may further comprise a magnetic material disposed so as to sandwich the U-shaped current path.

Moreover, a seventh aspect of the present invention may relate to a current sensor comprising: the current sensor substrate recited in any of the first to fourth aspects; and an IC chip that is disposed on the support portion of the current sensor substrate and includes a magneto-electric conversion element for detecting magnetic flux to be generated by electric current flowing through the current path of the current sensor substrate.

Moreover, an eighth aspect of the present invention relates to the seventh aspect, and wherein the magneto-electric conversion element may be disposed inside the U-shape of the U-shaped current path in a plan view.

A ninth aspect of the present invention may relate to a current sensor comprising: the current sensor substrate recited in the fifth or sixth aspect; and an IC chip that is disposed on the support portion of the current sensor substrate and includes a magneto-electric conversion element for detecting magnetic flux to be generated by electric current flowing through the current path of the current sensor substrate, and wherein the magneto-electric conversion element is disposed inside the U-shape of the U-shaped current path in a plan view.

A tenth aspect of the present invention relates to the ninth aspect, and wherein the magnetic material may be formed on an opposite IC chip surface to an IC chip surface on which the U-shaped current path is disposed so as to either partially or entirely cover the magneto-electric conversion element.

An eleventh aspect of the present invention relates to the ninth or tenth aspect, and wherein the magnetic material may be formed on the support portion so as to be away from the primary conductor.

A twelfth aspect of the present invention relates to any of the ninth to eleventh aspects, and wherein the magnetic material may be made of either a plated magnetic material or a magnetic chip.

A thirteenth aspect of the present invention relates to any of the seventh to twelfth aspects, and wherein the IC chip may be protruded from the support portion in a side view.

A fourteenth aspect of the present invention relates to the thirteenth aspect, and wherein the IC chip may be overlapped with the current path in a plan view, and the magneto-electric conversion element may be disposed inside the U-shape of the U-shaped current path in a plan view.

A fifteenth aspect of the present invention relates to the thirteenth or fourteenth aspect, and wherein the IC chip may be disposed away from the U-shaped current path at a predetermined interval in a side view.

A sixteenth aspect of the present invention relates to any of the thirteenth to fifteenth aspects, and wherein the primary conductor may not support the IC chip.

A seventeenth aspect of the present invention relates to any of the seventh to twelfth aspects, and wherein the support portion of the current sensor substrate may have a cutout portion; and in a plan view, the U-shaped current path of the current sensor substrate may be disposed in the cutout portion while being overlapped with the IC chip.

An eighteenth aspect of the present invention relates to any of the seventh to seventeenth aspects, and wherein the magneto-electric conversion element may be a hole element.

A nineteenth aspect of the present invention relates to any of the seventh to eighteenth aspects, and wherein the IC chip may further include a second magneto-electric conversion element disposed in a position outside the U-shape of the current path and closer to the current path.

A twentieth aspect of the present invention relates to any of the seventh to nineteenth aspects, and wherein the magneto-electric conversion element may be either a hole IC including a signal processing circuit or a magnetic resistance IC including a signal processing circuit.

A twenty-first aspect of the present invention relates to any of the seventh to twentieth aspects, and may further comprise an insulator member formed between the primary conductor of the current sensor substrate and the IC chip.

A twenty-second aspect of the present invention relates to the twenty-first aspect, and wherein the insulator member may be an insulator tape.

Advantageous Effects of Invention

According to the present invention, the current sensor substrate is designed to comprise: a primary conductor having a U-shaped current path; a support portion for supporting a magneto-electric conversion element; and a signal terminal side member having a lead terminal connected to the support portion, and wherein the U-shaped current path is not overlapped with the support portion in a plan view, while being formed so as to have a height different from a height of the support portion in a side view. Accordingly, the current sensor substrate and the current sensor can be configured simply and conveniently, while the number of components thereof can be suppressed, and thereby, manufacturing cost can be reduced.

DESCRIPTION OF EMBODIMENTS

With reference to the drawings, embodiments of the present invention will be hereinafter explained in detail.

First Embodiment

Figure 1:
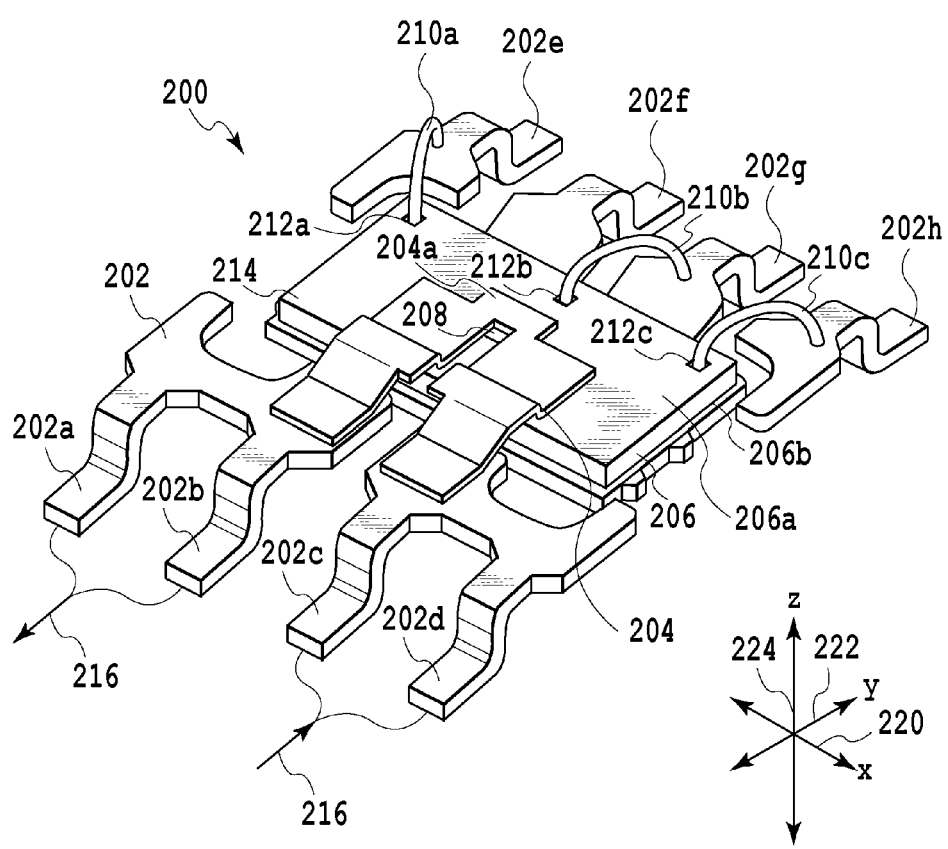
FIG. 1 is a diagram showing a conventional current sensor.
Figure 2:
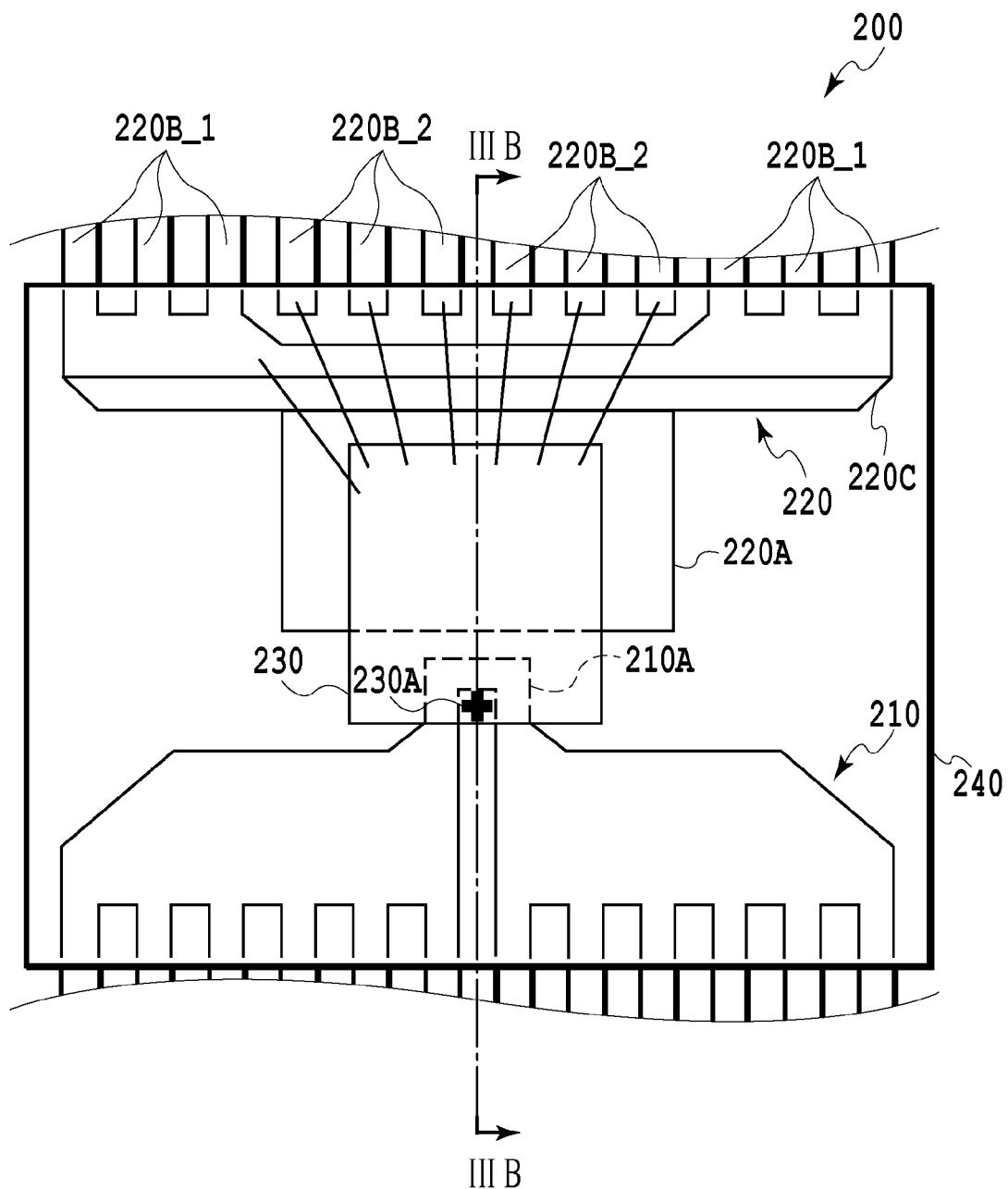
FIG. 2 is a diagram showing a current sensor according to a first embodiment.

FIG. 2 shows a current sensor according to a first embodiment. A current sensor 200 includes: a primary conductor 210 having a U-shaped current path 210A; a signal terminal side member 220 (hereinafter simply referred to as "the member 220" in an abbreviated manner) having a support portion 220A for supporting a magneto-electric conversion element 230A (e.g., a hole element) and lead terminals 220B_1 and 220B_2; and an IC chip 230 that is disposed on the support portion 220A and has the magneto-electric conversion element 230A for detecting magnetic flux to be generated by electric current flowing through the current path 210A. The current sensor 200 is formed by molding the primary conductor 210, the member 220 and the IC chip 230 by means of a resin 240. The remaining part, except for the IC chip 230 and the resin 240, is a current sensor substrate.

The lead terminals 220B_1 indicate lead terminals that are connected to the support portion 220A, whereas the lead terminals 220B_2 indicate lead terminals that are not connected to the support portion 220A. It should be noted that in commonly explaining the lead terminals 220B_1 and 220B_2, the respective lead terminals will be simply referred to as lead terminals 220B.

Figure 3A:
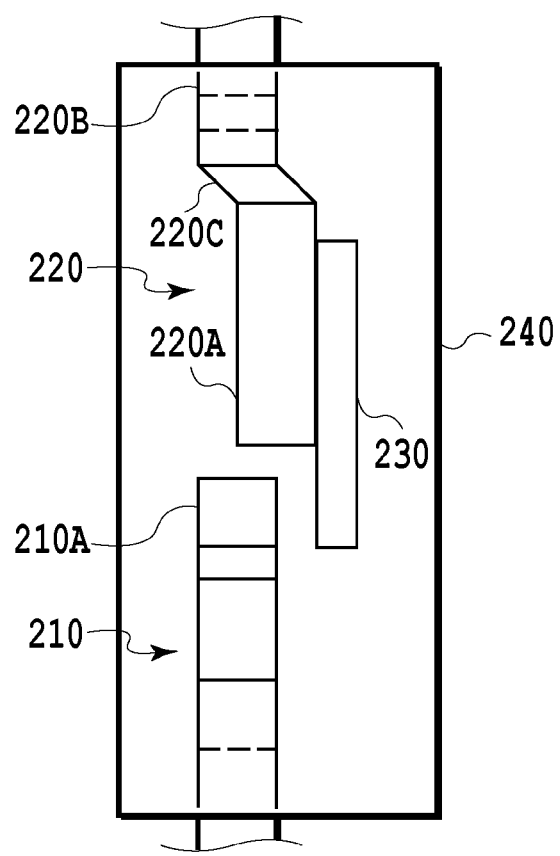
FIG. 3A is a side view of the current sensor shown in FIG. 2.
Figure 3B:
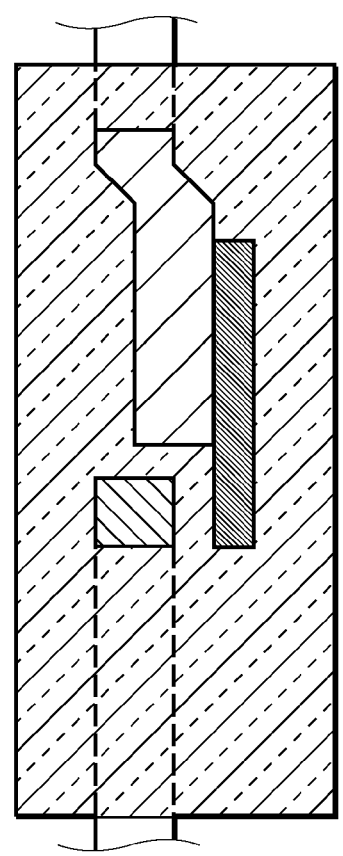
FIG. 3B is a cross-sectional view of FIG. 2 taken along a line IIIB-IIIB.

The current path 210A is disposed adjacently to the support portion 220A so as not to be overlapped with the support portion 220A in a plan view. Further, as is obvious from a side view of FIG. 3A and a cross-sectional view of FIG. 3B, the support portion 220A and the current path 210A are disposed such that the height of a flat portion of a support portion 220A surface on which the IC chip 230 is mounted is different from that of a flat portion of a current path 210A surface closer to the IC chip 230 in a side view.

The support portion 220A and the lead terminals 220B_1 are not separate members, and are integrally made of a metal material. In other words, the support portion 220A and the lead terminals 220B_1 are physically integrated and are connected to each other not only physically but also electrically.

As described above, magnetic flux density becomes high in the vicinity of the center of the inside of the U-shape, and accordingly, current detection sensitivity is enhanced. Hence, the magneto-electric conversion element 230A is disposed inside the U-shape of the current path 210A in a plan view. Moreover, the IC chip 230 is protruded from the support portion 220A in a side view, while being overlapped with the current path 210A in a plan view.

In the current sensor 200 according to the present embodiment, the member 220 has a step portion 220C between the support portion 220A and the lead terminals 220B. The step portion 220C of roughly 20-100 μm can be produced by means of, for instance, forming of the member 220. A clearance can be thereby obtained between the current path 210A and the IC chip 230. The clearance reliably achieves a high insulation and voltage resistance property between the primary conductor 210 and the IC chip 230, and can maintain a high insulation and voltage resistance property in the inside of the package. Suppose the step portion 220C does not exist, the conductive path 210A of the primary conductor 210 and the IC chip 230 make contact with each other. Even when an insulation sheet is preliminarily attached to the back surface of the IC chip 230, this results in a low insulation and voltage resistance property and electrical breakdown becomes likely to be caused. Moreover, it can be also assumed that an insulation sheet is preliminarily attached to the primary conductor 210. This results in complication in steps, and thereby, has low chances of becoming reality under the condition that suppress in manufacturing cost is required.

Figure 4A:
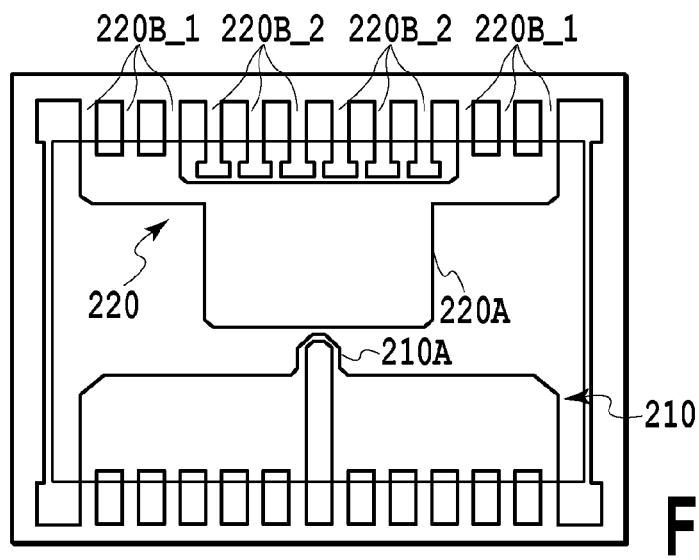
FIG. 4A is a diagram for explaining a method of manufacturing a current sensor according to an embodiment 1.
Figure 4B:
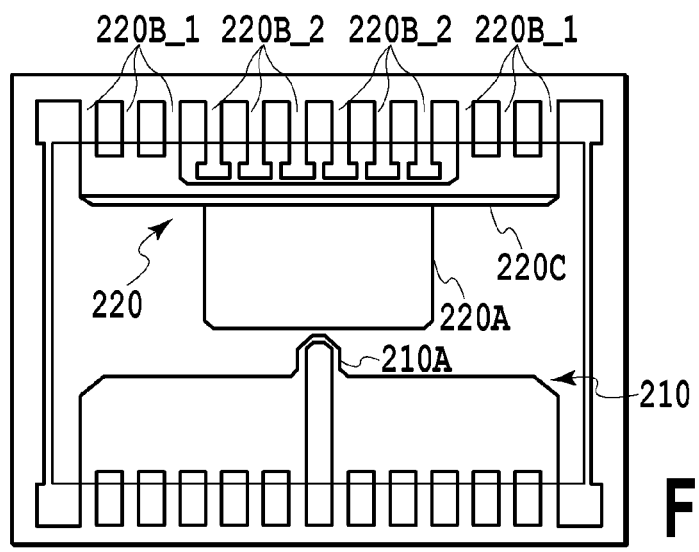
FIG. 4B is a diagram for explaining the method of manufacturing the current sensor according to the embodiment 1.
Figure 4C:
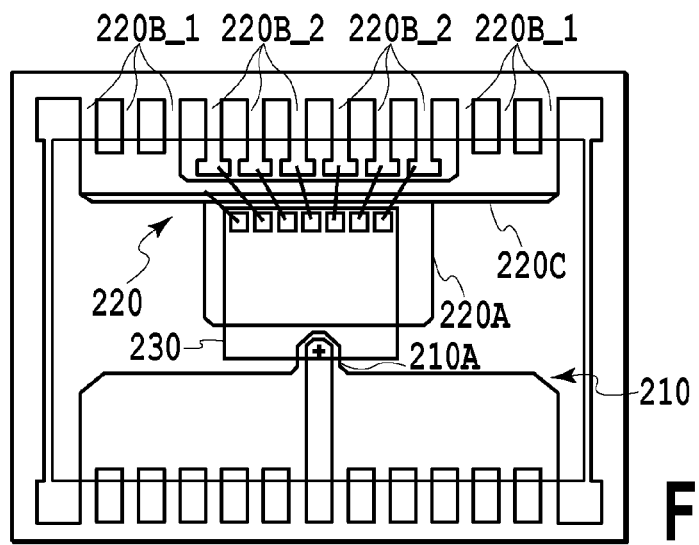
FIG. 4C is a diagram for explaining the method of manufacturing the current sensor according to the embodiment 1.
Figure 5A:
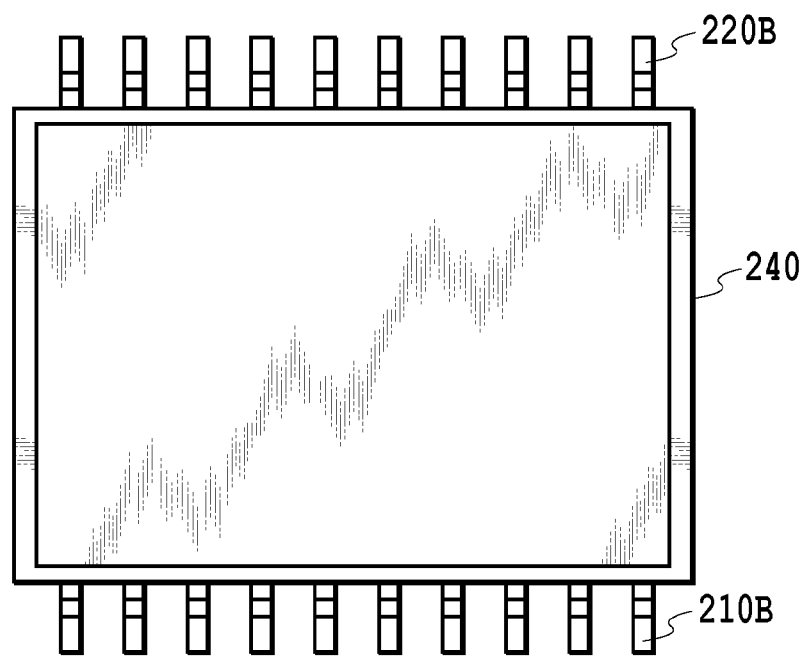
FIG. 5A is a diagram for explaining the method of manufacturing the current sensor according to the embodiment 1.
Figure 5B:
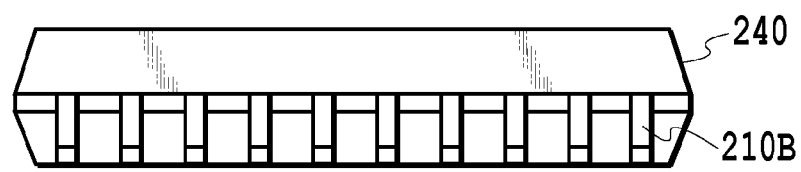
FIG. 5B is a diagram for explaining the method of manufacturing the current sensor according to the embodiment 1.
Figure 5C:
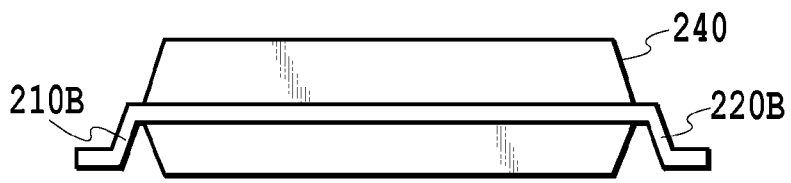
FIG. 5C is a diagram for explaining the method of manufacturing the current sensor according to the embodiment 1.

With reference to FIGS. 4A to 4C and FIGS. 5A to 5C, explanation will be herein made for a method of manufacturing the current sensor 200 according to an embodiment 1. First, a lead frame, on which a desired pattern is formed, is fabricated from a sheet of metal plate. FIG. 4A shows a part corresponding to a single current sensor. Next, the step portion 220C is produced in the member 220 by means of forming such as stamping (FIG. 4B). Then, the IC chip 230 is die-bonded to the support portion 220B, and thereafter, the lead terminals 220A and the IC chip 230 are wire-bonded (FIG. 4C). Finally, the primary conductor 210, the member 220 and the IC chip 230 are molded by means of the resin 240; lead cutting is performed; and the primary conductor terminals 210B and the lead terminals (signal terminals) 220B are formed by means of forming. FIG. 5A is a plan view; FIG. 5B is a front view; and FIG. 5C is a right side view.

Thus, the current sensor 200 according to the first embodiment can suppress the number of components and reduce manufacturing cost in comparison with a conventional sensor, and in addition, can reliably achieve a high insulation and voltage resistance property between the primary conductor 210 and the IC chip 230.

Figure 6A:
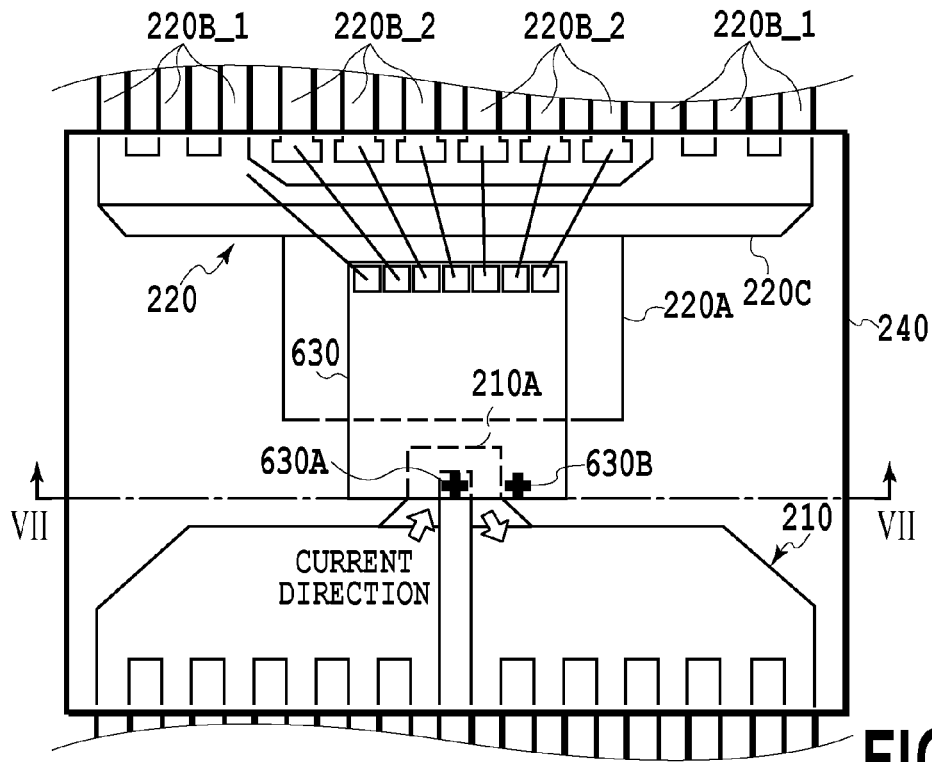
FIG. 6A is a diagram showing a modification of the current sensor according to the embodiment 1.
Figure 7:
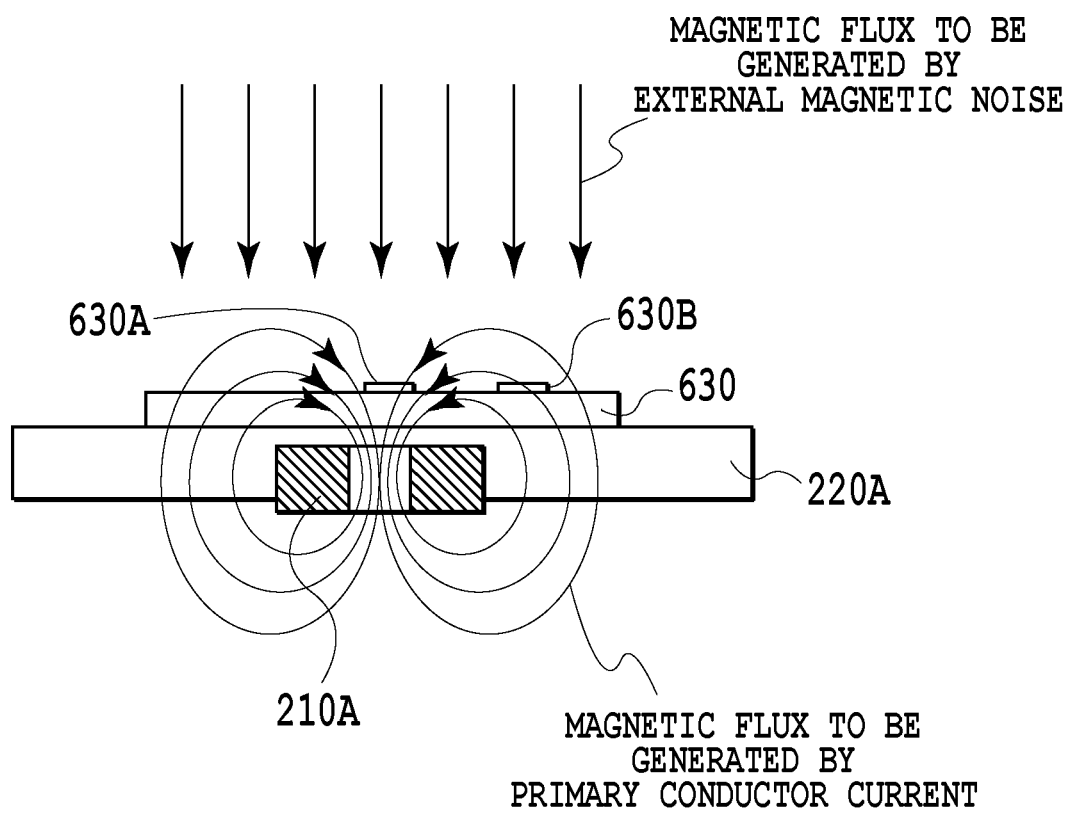
FIG. 7 is a diagram showing a cross-sectional view of FIG. 6A taken along a line VII-VII.

FIG. 6A shows a modification of the current sensor 200 according to the first embodiment. Except for an IC chip 630, a current sensor 600 is the same as the current sensor 200. When being disposed on the support portion 220A, the IC chip 630 is designed such that in a plan view, a first magneto-electric conversion element 630A is disposed inside the U-shape of the current path 210A whereas a second magneto-electric conversion element 630B is disposed in a position outside the U-shape of the current path 210A and closer to the current path 210A. FIG. 7 shows a cross-sectional view of FIG. 6A taken along a line VII-VII. The density of magnetic flux to be generated by electric current flowing through the primary conductor in the position of the first magneto-electric conversion element 630A is set to be B1s, whereas that in the position of the second magneto-electric conversion element 630B is set to be B2s. Where the densities of magnetic flux to be generated by external magnetic noise in the respective positions are set to be B1n and B2n, outputs Vo1 and Vo2 of the first magneto-electric conversion element 630A and the second magneto-electric conversion element 630B are derived as follows.

$$Vo1=k1\times(B1s+B1n)+Vu1$$

$$Vo2=k2\times(-B2s+B2n)+Vu2$$

It should be noted that k1 and k2 are sensitivity coefficients of the respective elements, whereas Vu1 and Vu2 are offset values of the respective elements.

It is herein assumed that variation in characteristics of the both magneto-electric conversion elements is quite small and the relations "k1=k2=k" and "Vu1=Vu2" are established. Further, the distance between the both magneto-electric conversion elements is small, and therefore, approximation is performed as "B1n=B2n". Accordingly, the following is derived.

$$Vo=Vo1-Vo2=k\times(B1s+B2s)$$

Noise attributed to external magnetic field disappears, while it is possible to obtain a signal greater than that obtained when only the first magneto-electric conversion element 630A disposed inside the U-shape is used. Hence, this results in enhancement in sensitivity.

Figure 6B:
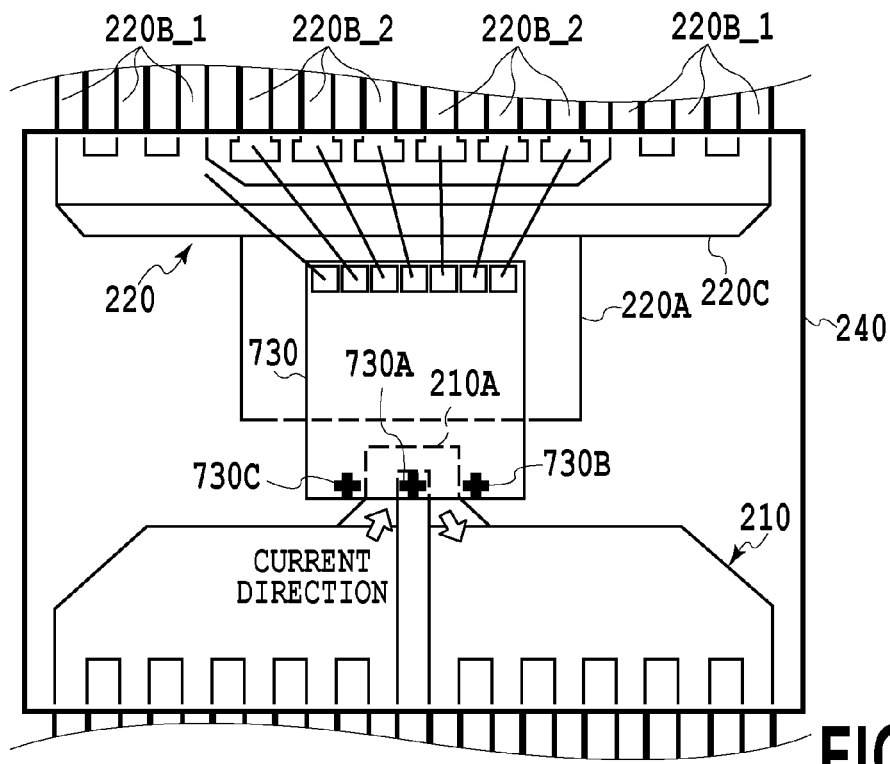
FIG. 6B is a diagram showing a modification of the current sensor according to the embodiment 1.

Moreover, FIG. 6B shows an example of using three magneto-electric conversion elements as another modification of the current sensor 200 according to the first embodiment. A current sensor 700 is the same as the current sensor 200 except for an IC chip 730. When being disposed on the support portion 220A, the IC chip 730 is designed such that in a plan view, a first magneto-electric conversion element 730A is disposed inside the U-shape of the current path 210A whereas a second magneto-electric conversion element 730B and a third magneto-electric conversion element 730C are disposed in positions outside the both ends of the U-shape of the current path 210A and closer to the current path 210A. The following is derived where the density of magnetic flux to be generated by electric current flowing through the primary conductor 210 in the position of the third magneto-electric conversion element 730C is set to be B3s, whereas the density of magnetic flux to be generated by external magnetic noise in the position of the third magneto-electric conversion element 730C is set to be B3n.

$$Vo=Vo1-(Vo2+Vo3)/2=k\times(B1s+(B2s+B3s)/2)$$

Similarly to the example of using two magneto-electric conversion elements, noise attributed to external magnetic field disappears and sensitivity is enhanced. Moreover, the variation level of the output Vo can be suppressed as much as possible, even when the positional relation between the primary conductor 210 and the IC chip 730 is displaced in the directions that the three magneto-electric conversion elements are disposed.

Moreover, as a form of the U-shaped current path, a current path formed in a C-shape, a V-shape or the like, for instance, may be used for the current path 210A.

Second Embodiment

Figure 8:
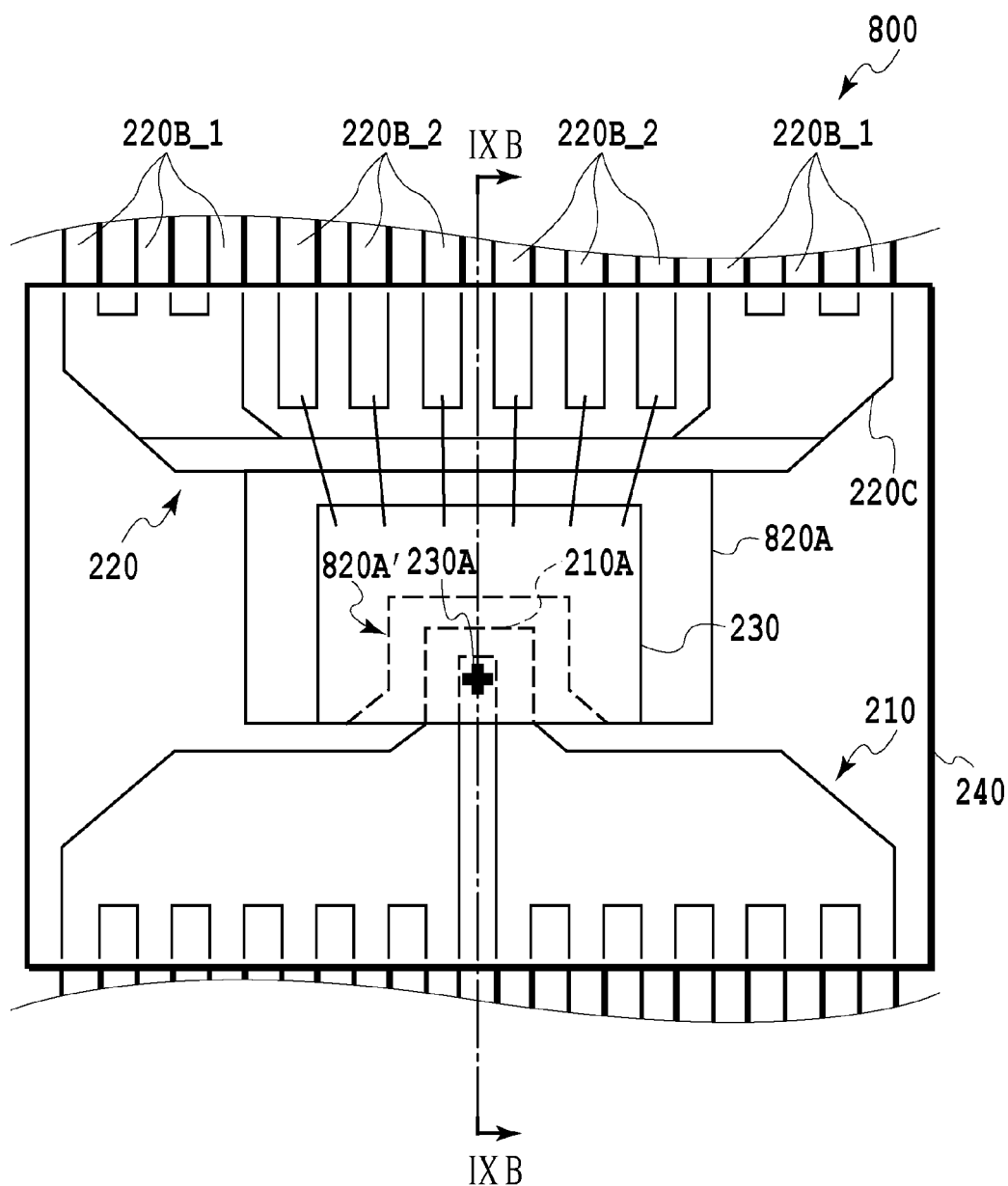
FIG. 8 is a diagram showing a current sensor according to a second embodiment.
Figure 9A:
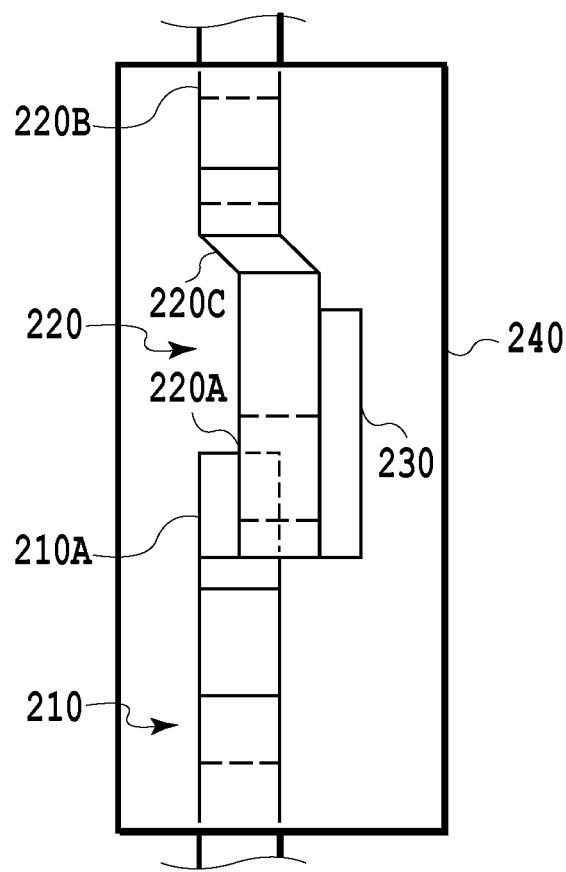
FIG. 9A is a side view of the current sensor shown in FIG. 8.
Figure 9B:
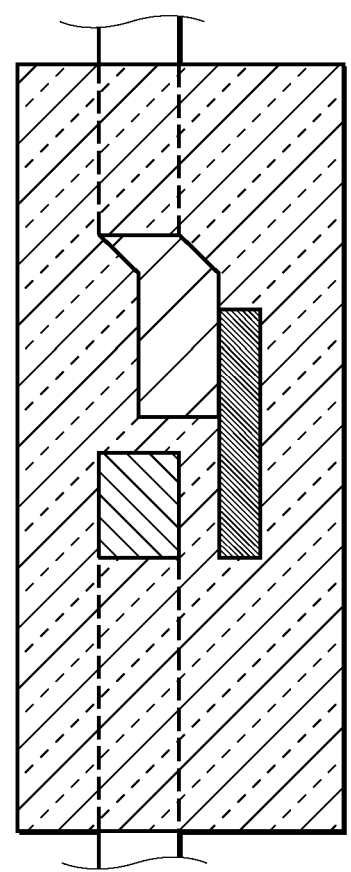
FIG. 9B is a cross-sectional view of the current sensor shown in FIG. 8.

FIG. 8 shows a current sensor according to a second embodiment. A current sensor 800 is different from the current sensor 200 of the first embodiment in that a support portion 820A of the member 220 has a cutout portion 820A' and the current path 210A is disposed in the cutout portion 820A' in a plan view, although the IC chip 230 is not protruded from the support portion 220A in a side view. Therefore, although not being protruded, the IC chip 230 is overlapped with the current path 210A in a plan view. FIG. 9A shows a side view, whereas FIG. 9B shows a cross-sectional view. The current path 210A, having a height different from that of the current path of the first embodiment in a side view, is disposed in the cutout portion 820A' in a plan view. Hence, processing of a stamping die for a lead frame becomes slightly complicated. However, the magneto-electric conversion element can be flexibly disposed within the IC chip, and thus, can be disposed as inside as possible within the IC chip. Therefore, influence on offset, which is attributed to stress, can be reduced. Moreover, an area in which the support portion and the IC chip are bonded is increased. Hence, the IC chip can be more stably supported.

It should be noted that similarly to the first embodiment, the IC chip 230 can be set as the IC chip 630 including two magneto-electric conversion elements or the IC chip 730 including three magneto-electric conversion elements.

Third Embodiment

Figure 10:
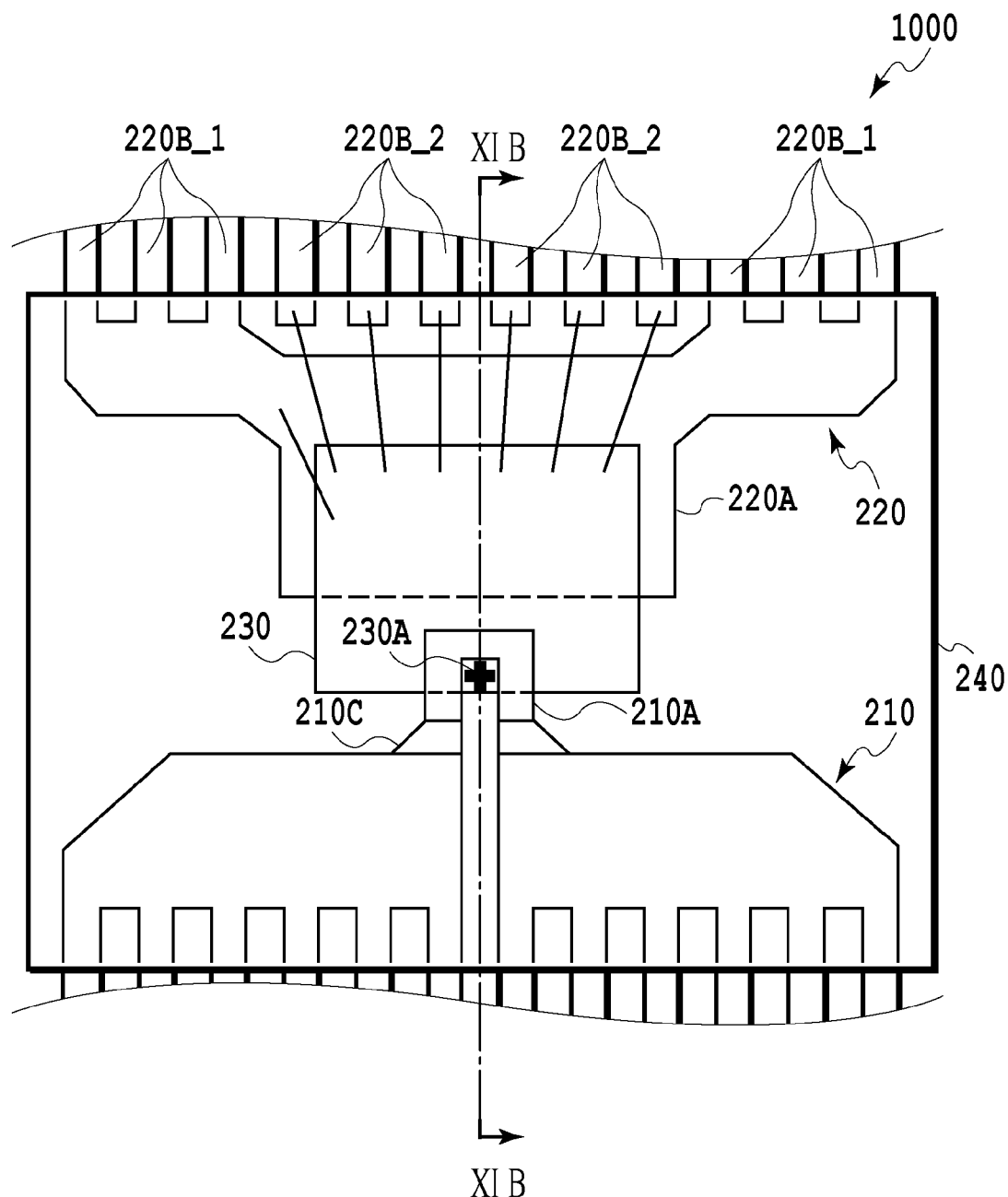
FIG. 10 is a diagram showing a current sensor according to a third embodiment.
Figure 11A:
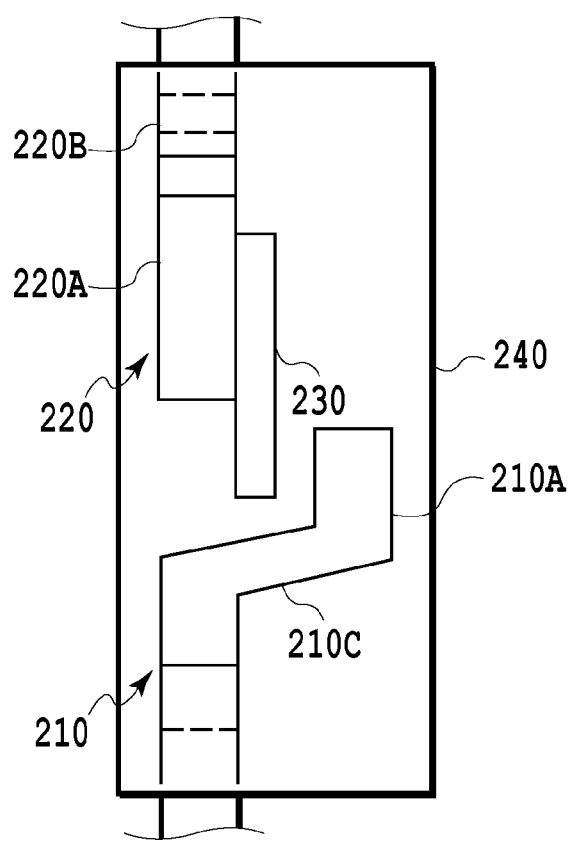
FIG. 11A is a side view of the current sensor shown in FIG. 10.
Figure 11B:
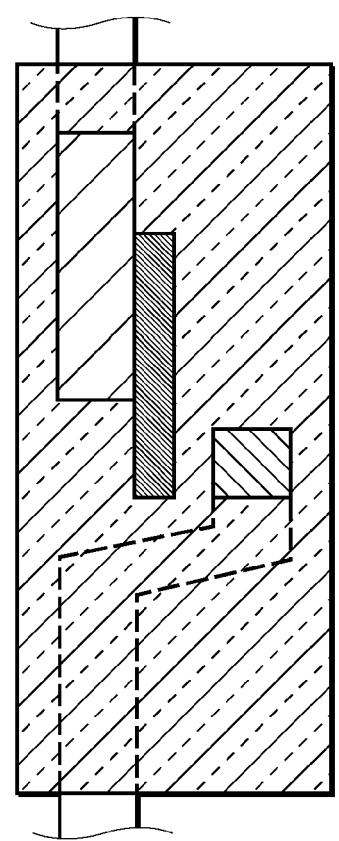
FIG. 11B is a cross-sectional view of the current sensor shown in FIG. 10.

FIG. 10 shows a current sensor according to a third embodiment. A current sensor 1000 is different from the current sensor 200 of the first embodiment in that not the member 220 but the primary conductor 210 has a step portion 210C in a position adjacent to the current path 210A. The IC chip 230 is protruded from the support portion 220A in a side view, while being overlapped with the current path 210A in a plan view. FIG. 11A shows a side view, whereas FIG. 11B shows a cross-sectional view.

It should be noted that similarly to the first embodiment, the IC chip 230 may be set as the IC chip 630 including two magneto-electric conversion elements or the IC chip 730 including three magneto-electric conversion elements.

Fourth Embodiment

Next, with reference to FIGS. 12 and 13, as an embodiment of the current sensor, explanation will be made for a current sensor that the current detection sensitivity thereof is enhanced while intrusion of external magnetic field can be inhibited. The current sensor of the present embodiment is roughly the same as that of the first embodiment shown in FIG. 2 regarding the entire configuration, but is different from that of the first embodiment regarding the configuration having magnetic materials.

The configuration of the current sensor of the present embodiment will be hereinafter explained mainly regarding the difference from the configuration of the current sensor of the first embodiment.

Figure 12:
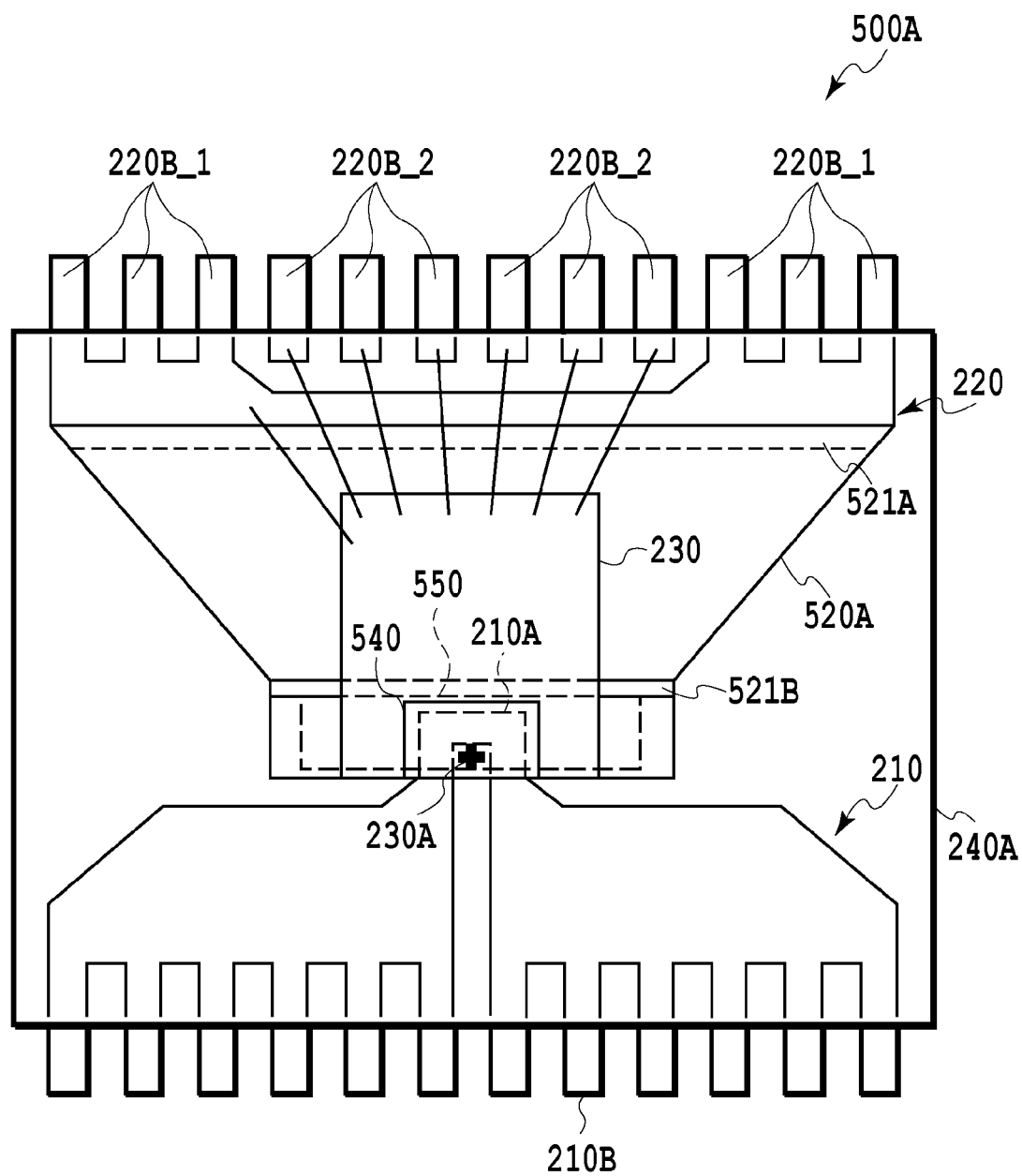
FIG. 12 is a diagram showing an example of a current sensor according to a fourth embodiment.

FIG. 12 shows an exemplary configuration of a current sensor according to a fourth embodiment. As shown in FIG. 12, similarly to the current sensor shown in FIG. 2, the present current sensor 500A includes: the primary conductor 210 having the current path 210A formed in a U-shape, for instance, and the conductor terminals 210B; the member 200 having the lead terminals 220B and a support portion 520A for supporting the magneto-electric conversion element 230A; and the IC chip 230 having the magneto-electric conversion element 230A. The primary conductor 210, the member 220 and the IC chip 230 are molded by means of a resin 240A.

By contrast, unlike the current sensor shown in FIG. 2, a magnetic material chip 540 made of a magnetic material is formed on the IC chip 230 in the present embodiment. Moreover, unlike the current sensor shown in FIG. 2, the support portion 520A is further configured to support a magnetic material chip 550 made of a magnetic material such as ferrite. In the present embodiment, the support portion 520A has, for instance, two step portions 521A and 521B. The shapes of the step portions 521A and 521B will be explained with reference to FIG. 13 to be described.

The magnetic material chips 540 and 550 are disposed such that magnetic flux to be generated by electric current flowing through the current path 210A of the primary conductor 210 is converged on a magneto-sensitive part of the magneto-electric conversion element 230A.

It should be noted that the current sensor 500A becomes a current sensor substrate by removing the IC chip 230 and the resin 240A from the aforementioned respective components of the current sensor 500A.

Figure 13:
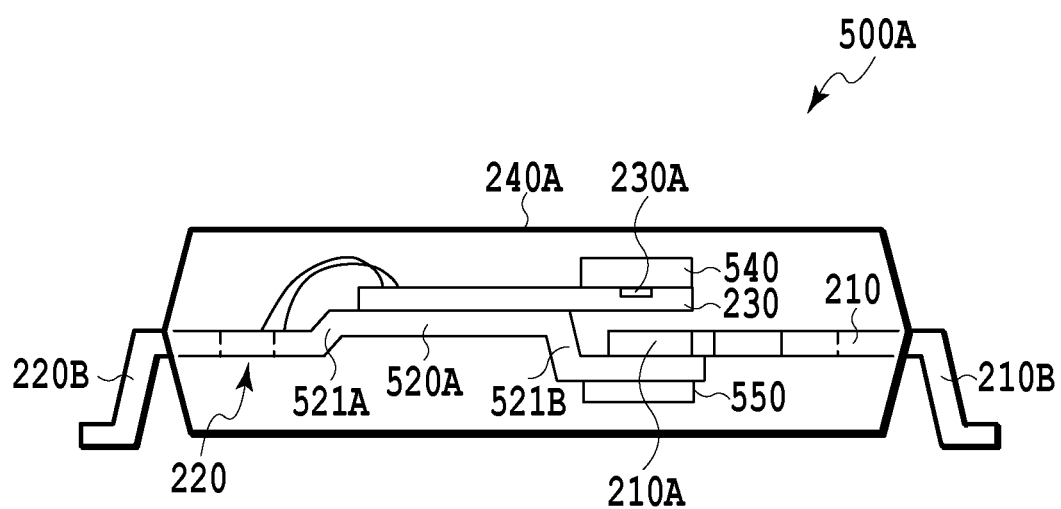
FIG. 13 is a side view of the current sensor shown in FIG. 12.

FIG. 13 is a side view of the current sensor 500A of FIG. 12. In the present current sensor 500A, the step portion 521A of the support portion 520A is formed such that the middle part of the support portion 520A is upwardly protruded, whereas the step portion 521B is formed such that the tip end of the support portion 520A is more downwardly protruded than the primary conductor 210.

Further, the magnetic material chip 550 is formed on the lower part of the support portion 520A. In other words, the magnetic material chip 550 is formed on the support portion 520A while being separated away from the primary conductor 210.

In the aforementioned configuration of the current sensor 500A, the magnetic material chips 540 and 550 are formed. Hence, when electric current flows through the current path of the primary conductor 210, magnetic flux to be generated by the electric current becomes likely to be converged on the magneto-sensitive part of the magneto-electric conversion element 230A. Therefore, the current detection sensitivity of the current sensor 500A is enhanced.

Moreover, with the formation of the magnetic material chips 540 and 550, external magnetic field is supposed to be inhibited from intruding into the current sensor 500A.

Fifth Embodiment

Next, a fifth embodiment will be explained with reference to FIGS. 14 and 15.

In the fourth embodiment shown in FIGS. 12 and 13, the two magnetic material chips 540 and 550 are formed. The present embodiment relates to a current sensor in which the single magnetic chip 540 is only formed, whereby the current detection sensitivity thereof can be enhanced while intrusion of external magnetic field can be inhibited.

Figure 14:
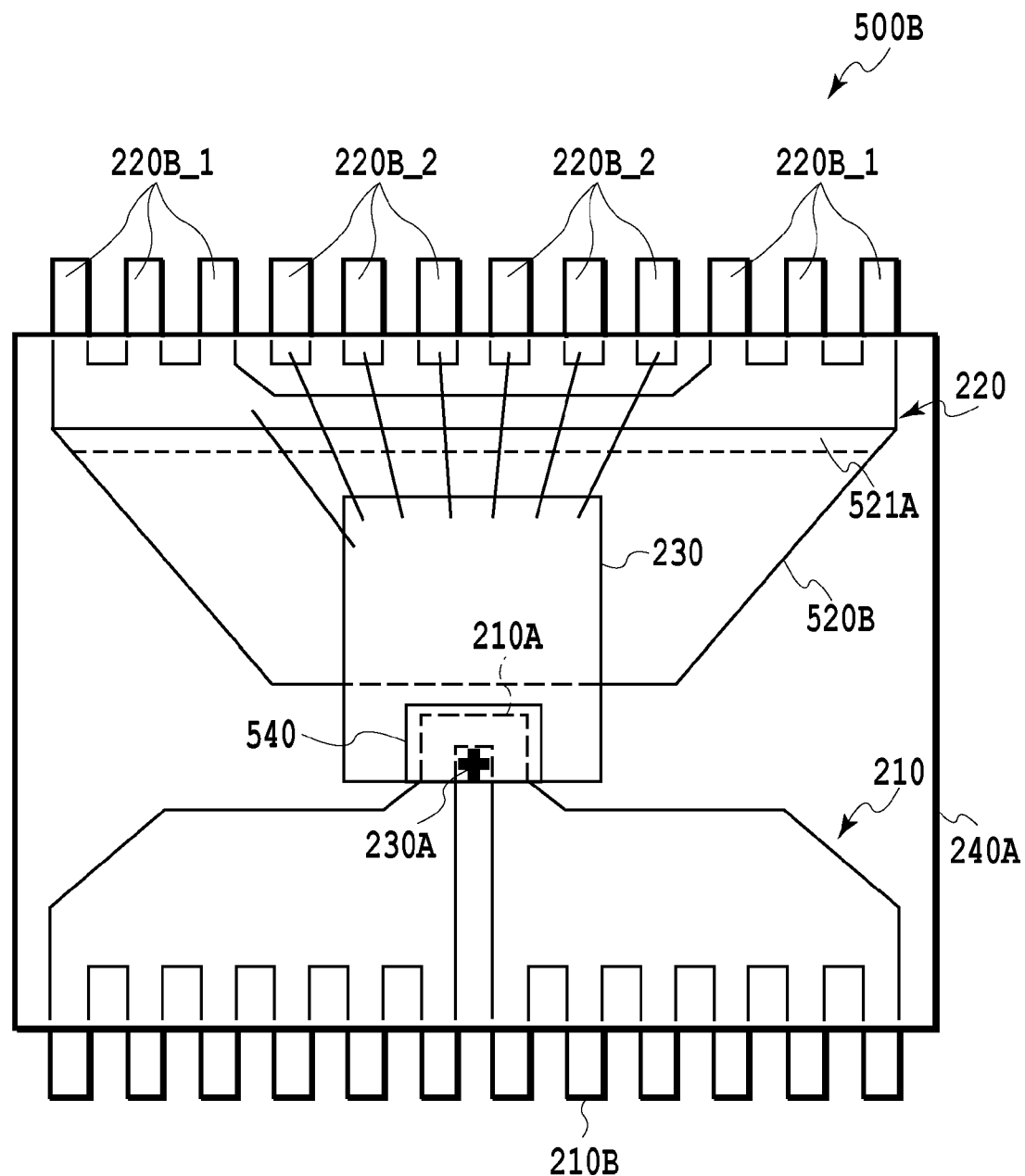
FIG. 14 is a diagram showing an example of a current sensor according to a fifth embodiment.

FIG. 14 shows an exemplary configuration of the current sensor according to the fifth embodiment. Similarly to the current sensor shown in FIG. 12, the current sensor 500B of the present embodiment includes: the primary conductor 210 having the current path 210A formed in a U-shape, for instance; the member 220 having the lead terminals 220B and a support portion 520B for supporting the magneto-electric conversion element 230A; and the IC chip 230 having the magneto-electric conversion element 230A.

Moreover, similarly to the current sensor shown in FIG. 12, the magnetic material chip 540 made of a magnetic material is formed on the IC chip 230. The primary conductor 210, the member 220 and the IC chip 230 are molded by means of the resin 240A.

On the other hand, unlike the current sensor shown in FIG. 12, the support portion 520B of the present embodiment includes, for instance, only the single step portion 521A.

It should be noted that the current sensor 500B becomes a current sensor substrate by removing the IC chip 230 and the resin 240A from the aforementioned respective components of the current sensor 500B.

Figure 15:
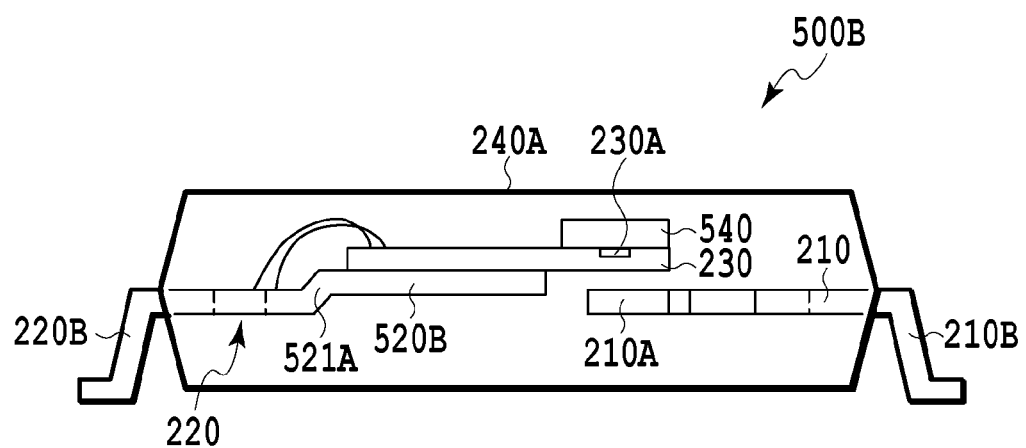
FIG. 15 is a side view of the current sensor shown in FIG. 14.

FIG. 15 is a side view of the current sensor 500B shown in FIG. 14. Similarly to the current sensor shown in FIG. 13, in the present current sensor 500B, the step portion 521A of the support portion 520B is formed such that the middle part of the support portion 520B is upwardly protruded. Moreover, similarly to the current sensor shown in FIG. 13, the magnetic material chip 540 is disposed on the IC chip 230 such that magnetic flux to be generated by electric current flowing through the current path 210A of the primary conductor 210 is converged on the magneto-sensitive part of the magneto-electric conversion element 230A.

In the aforementioned structure of the current sensor 500B, the magnetic material chip 540 is formed. Hence, when electric current flows through the current path of the primary conductor 210, magnetic flux to be generated by the electric current becomes likely to be converged on the magneto-sensitive part of the magneto-electric conversion element 230A. Therefore, the current detection sensitivity of the current sensor 500B is enhanced.

Moreover, with the formation of the magnetic material chip 540, external magnetic field is supposed to be inhibited from intruding into the current sensor 500B from the upper surface of the package.

Sixth Embodiment

Next, a sixth embodiment will be explained with reference to FIGS. 16 and 17.

In the fourth embodiment shown in FIGS. 12 and 13, the two magnetic material chips 540 and 550 are formed. The present embodiment relates to a current sensor in which the single magnetic chip 550 is only formed, whereby the current detection sensitivity thereof can be enhanced while intrusion of external magnetic field can be inhibited.

Figure 16:
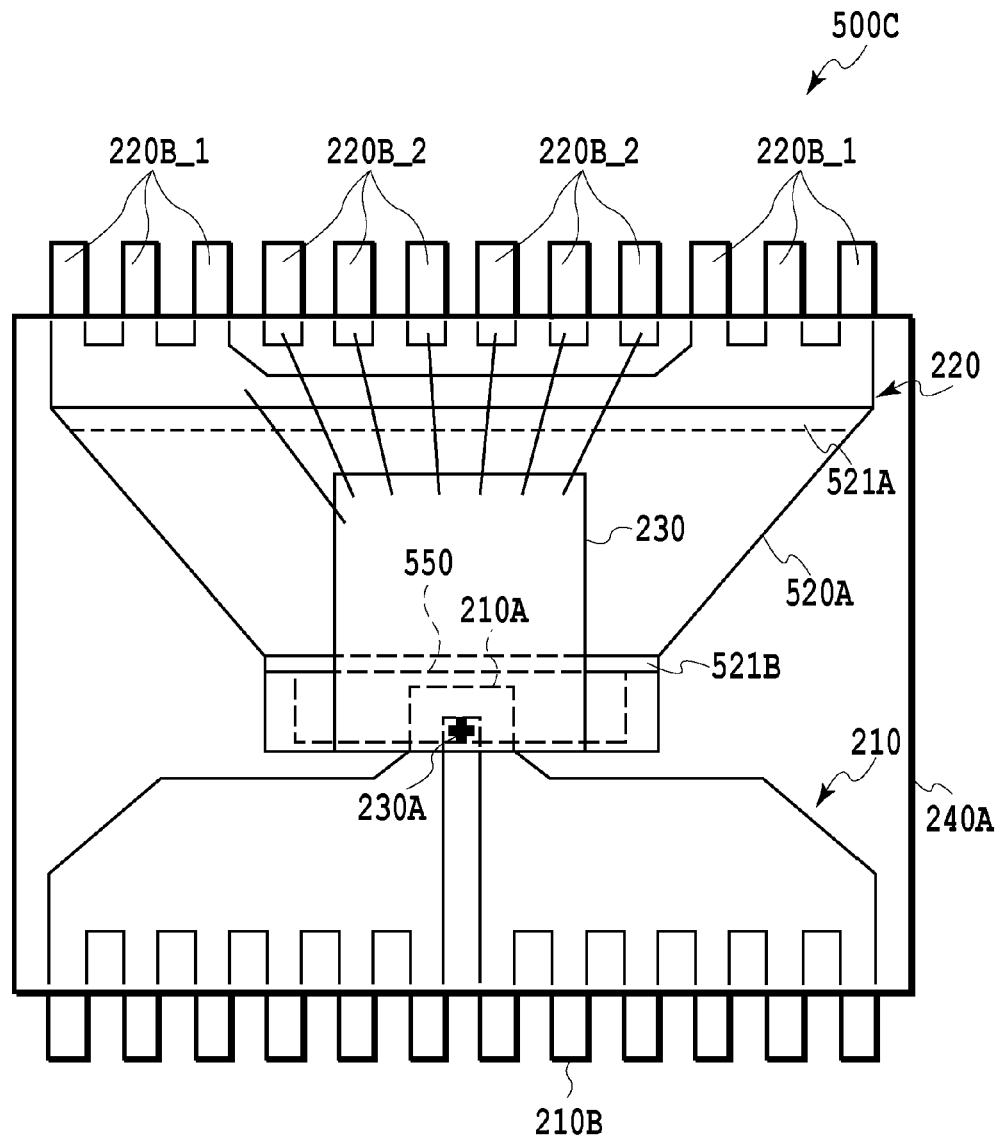
FIG. 16 is a diagram showing an example of a current sensor according to the fifth embodiment.

FIG. 16 shows an exemplary configuration of the current sensor according to the sixth embodiment. Similarly to the current sensor shown in FIG. 12, the current sensor 500C of the present embodiment includes: the primary conductor 210 having, for instance, the U-shaped current path 210A; the member 200 having the lead terminals 220B and the support portion 520A for supporting the magneto-electric conversion element 230A; and the IC chip 230 having the magneto-electric conversion element 230A. Moreover, similarly to the current sensor shown in FIG. 12, the magnetic material chip 540 made of a magnetic material is formed on the lower part of the support portion 520A. The primary conductor 210, the member 220 and the IC chip 230 are molded by means of the resin 240A.

It should be noted that the current sensor 500C becomes a current sensor substrate by removing the IC chip 230 and the resin 240A from the aforementioned respective components of the current sensor 500C.

Figure 17:
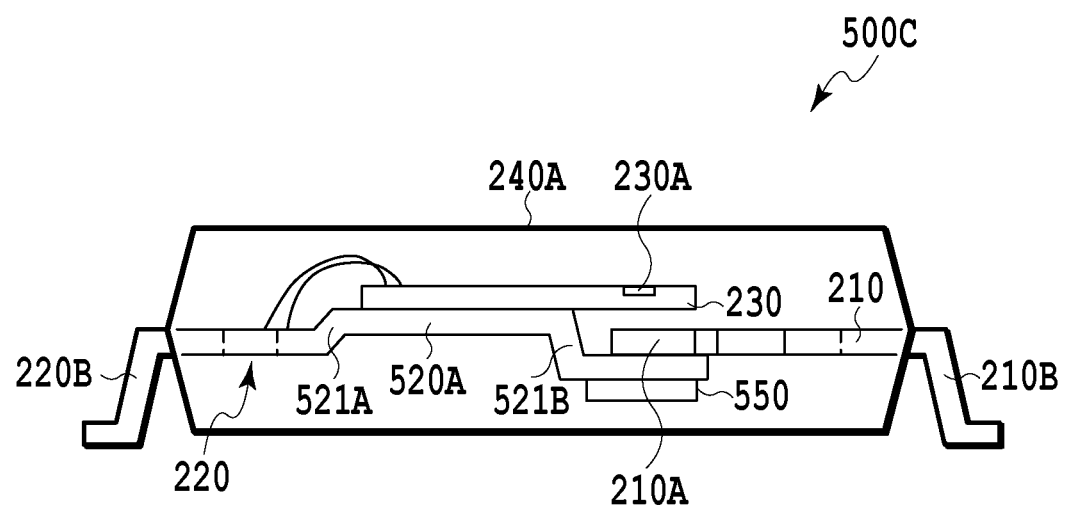
FIG. 17 is a side view of the current sensor shown in FIG. 16.

FIG. 17 is a side view of the current sensor 500C shown in FIG. 16. Similarly to the current sensor shown in FIG. 13, in the present current sensor 500C, the step portion 521A of the support portion 520A is formed such that the middle part of the support portion 520A is upwardly protruded, whereas the step portion 521B is formed such that the tip end of the support portion 520A is more downwardly protruded than the primary conductor 210. Further, similarly to the current sensor shown in FIG. 13, the magnetic material chip 550 is disposed on the lower part of the support portion 520A such that magnetic flux to be generated by electric current flowing through the current part 210A of the primary conductor 210 is converged on the magneto-sensitive part of the magneto-electric conversion element 230A.

In the aforementioned configuration of the current sensor 500C, the magnetic material chip 550 is formed. Hence, when electric current flows through the current path of the primary conductor 210, magnetic resistance is reduced and magnetic flux to be generated by the primary conductor current is increased. Therefore, the current detection sensitivity of the current sensor 500C is enhanced.

Moreover, with the formation of the magnetic material chip 550, external magnetic field is supposed to be inhibited from intruding into the current sensor 500C from the back surface of the package.

MODIFICATIONS

The aforementioned current sensors according to the respective embodiments are exemplary only, and can be changed as described below.

Regarding the current sensors 500A, 500B and 500C of the respective embodiments, the primary conductor 210 having, for instance, the U-shaped current path 210A, has been explained as an example. However, as another exemplary shape of the current path 210A, the current path 210A may be configured to have, for instance, any other shape as long as the current sensor functions can be implemented.

Regarding the current sensors 500A, 500B and 500C of the respective embodiments, explanation has been made for the examples that the IC chip 230 having the single magneto-electric conversion element is applied. However, as an example, the IC chip may be configured to have, for instance, two or more magneto-electric conversion elements. In this case, it is preferable to dispose a magnetic material such that magnetic flux is converged on the magneto-sensitive parts of the respective magneto-electric conversion elements.

Regarding the current sensors 500A, 500B and 500C of the respective embodiments, explanation has been made for the examples that the magnetic material chips 540 and 550 made of magnetic materials are applied. However, as an exemplary configuration of the magnetic material, for instance, a plated magnetic material or the like to be formed on the IC surface or the like may be employed.

Regarding the current sensors 500A, 500B and 500C of the respective embodiments, it is preferable to form an insulator member between the primary conductor 210 and the IC chip 230 so as to cover the primary conductor 210. For example, the insulator member is preferably an insulator tape that is made of a sheet material with a good voltage resistance property and that an adhesive agent is applied to one surface thereof.

The respective support portions 520A and 520B of the current sensors 500A, 500B and 500C of the respective embodiments have the step portions. The shapes of the step portions can be changed as long as the height of the support portions can be changed. Moreover, the number of the step portions may be three or more as long as the current sensor functions can be implemented.

Each of the magneto-electric conversion elements of the respective embodiments may be either a hole IC including a signal processing circuit or a magnetic resistance IC including a signal processing circuit.

REFERENCE SIGNS LIST

200 Current sensor
210 Primary conductor
210A Current path
210B Primary conductor terminal
210C Step portion
220 Signal terminal side member
220A Support portion
220B, 220B_1, 220B_2 Lead terminal
220C Step portion
230 IC chip
230A Magneto-electric conversion element
500A, 500B, 500C Current sensor
520A, 520B Step portion
630 IC chip
630A First magneto-electric conversion element
630B Second magneto-electric conversion element
800 Current sensor
820A Support portion
820A' Cutout portion
1000 Current sensor

The invention claimed is:

1. A current sensor substrate, comprising:
a primary conductor having a U-shaped current path;
a support portion for supporting a magneto-electric conversion element; and
a lead terminal connected to the support portion,
wherein the U-shaped current path is not overlapped with the support portion in a plan view, while being formed so as to have a height different from a height of the support portion in a side view.

2. The current sensor substrate recited in claim 1, wherein the lead terminal is connected to the support portion through a step.

3. The current sensor substrate recited in claim 1, wherein the support portion has a cutout portion, and
the U-shaped current path is disposed in the cutout portion in a plan view.

4. The current sensor substrate recited in claim 1, wherein the primary conductor has a step portion connected to the U-shaped current path.

5. The current sensor substrate recited in claim 1, further comprising:
a magnetic material disposed so as to be overlapped with the U-shaped current path in a plan view.

6. The current sensor substrate recited in claim 5, further comprising:
a magnetic material disposed so as to sandwich the U-shaped current path.

7. A current sensor, comprising:
the current sensor substrate recited in claim 1; and
an IC chip disposed on the support portion of the current sensor substrate, the IC chip including a magneto-electric conversion element for detecting magnetic flux to be generated by electric current flowing through the U-shaped current path of the current sensor substrate.

8. The current sensor recited in claim 7, wherein the magneto-electric conversion element is disposed inside the U-shape of the U-shaped current path in a plan view.

9. A current sensor, comprising:
the current sensor substrate recited in claim 5; and
an IC chip disposed on the support portion of the current sensor substrate, the IC chip including a magneto-electric conversion element for detecting magnetic flux to be generated by electric current flowing through the current path of the current sensor substrate,
wherein the magneto-electric conversion element is disposed inside the U-shape of the U-shaped current path in a plan view.

10. The current sensor recited in claim 9, wherein the magnetic material is formed on an opposite IC chip surface to an IC chip surface on which the U-shaped current path is disposed so as to either partially or entirely cover the magneto-electric conversion element.

11. The current sensor recited in claim 9, wherein the magnetic material is formed on the support portion so as to be away from the primary conductor.

12. The current sensor recited in claim 9, wherein the magnetic material is made of either a plated magnetic material or a magnetic chip.

13. The current sensor recited in claim 7, wherein the IC chip is protruded from the support portion in a side view.

14. The current sensor recited in claim 13, wherein the IC chip is overlapped with the current path in a plan view, and
the magneto-electric conversion element is disposed inside the U-shape of the U-shaped current path in a plan view.

15. The current sensor recited in claim 13, wherein the IC chip is disposed away from the U-shaped current path at a predetermined interval in a side view.

16. The current sensor recited in claim 13, wherein the primary conductor does not support the IC chip.

17. The current sensor recited in claim 7, wherein the support portion of the current sensor substrate has a cutout portion, and
in a plan view, the U-shaped current path of the current sensor substrate is disposed in the cutout portion while being overlapped with the IC chip.

18. The current sensor recited in claim 7, wherein the magneto-electric conversion element is a hole element.

19. The current sensor recited in claim 7, wherein the IC chip further includes a second magneto-electric conversion element disposed in a position outside the U-shape of the current path and closer to the current path.

20. The current sensor recited in claim 7, wherein the magneto-electric conversion element is either a hole IC including a signal processing circuit or a magnetic resistance IC including a signal processing circuit.

21. The current sensor recited in claim 7, further comprising:
an insulator member formed between the primary conductor of the current sensor substrate and the IC chip.

22. The current sensor recited in claim 21, wherein the insulator member is an insulator tape.

* * * * *